US007312634B2

United States Patent
Rhee

(10) Patent No.: US 7,312,634 B2
(45) Date of Patent: Dec. 25, 2007

(54) EXCLUSIVE-OR AND/OR EXCLUSIVE-NOR CIRCUITS INCLUDING OUTPUT SWITCHES AND RELATED METHODS

(75) Inventor: Young-chul Rhee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 48 days.

(21) Appl. No.: 11/353,527

(22) Filed: Feb. 14, 2006

(65) Prior Publication Data
US 2006/0181310 A1    Aug. 17, 2006

(30) Foreign Application Priority Data
Feb. 17, 2005   (KR) .................... 10-2005-0013154

(51) Int. Cl.
*H03K 19/21* (2006.01)
(52) U.S. Cl. .......................... 326/55; 326/52; 326/54
(58) Field of Classification Search ................ 326/52, 326/53, 54, 55, 83
See application file for complete search history.

(56) References Cited

U.S. PATENT DOCUMENTS 4,417,161 A * 11/1983 Uya ........................ 326/55

FOREIGN PATENT DOCUMENTS

| JP | 56126326 A | * 10/1981 |
| JP | 63042222 A | * 2/1988 |
| JP | 05-152937 | 6/1993 |
| JP | 07-264049 | 10/1995 |
| KR | 100176326 | 11/1998 |

* cited by examiner

*Primary Examiner*—Daniel Chang
(74) *Attorney, Agent, or Firm*—Myers Bigel Sibley & Sajovec

(57) ABSTRACT

An exclusive-OR circuit may include a NAND gate configured to receive a plurality of input signals and a NOR gate configured to receive the plurality of input signals. The exclusive-OR circuit may also include a switch configured to couple an output signal of the NAND gate to an output node when an output signal of the NOR gate is "LOW", and a pull-down circuit configured to pull down the output node when the output signal of the NOR gate is "HIGH". An exclusive-NOR circuit may include a NAND gate configured to receive a plurality of input signals and a NOR gate configured to receive the plurality of input signals. The exclusive-NOR circuit may also include a switch configured to couple an output signal of the NOR gate to an output node when an output signal of the NAND gate is "HIGH", and a pull-up circuit configured to pull up the output node when the output signal of the NAND gate is "LOW".

22 Claims, 9 Drawing Sheets

FIG. 7

| A | B | XNOR CIRCUIT | | XOR CIRCUIT | |
|---|---|---|---|---|---|
| | | NOR | XNOR | NAND | XOR |
| 0 | 0 | 1 | 1 | '1' → | 0 |
| 0 | 1 | 0 | 0 | 1 | 1 |
| 1 | 0 | 0 | 0 | 1 | 1 |
| 1 | 1 | '0' → | 1 | 0 | 0 |

US 7,312,634 B2

EXCLUSIVE-OR AND/OR EXCLUSIVE-NOR CIRCUITS INCLUDING OUTPUT SWITCHES AND RELATED METHODS

RELATED APPLICATION

This application claims priority to Korean Application Serial No. 10-2005-0013154, filed Feb. 17, 2005, the disclosure of which is hereby incorporated herein by reference.

FIELD OF THE INVENTION

The present invention relates to logic circuits, and more particularly, to exclusive-OR (XOR) circuits, exclusive-NOR (XNOR) circuits, and related methods.

BACKGROUND

Various types of logic circuits are used for high-speed operations. One of the more common types is a complex logic circuit using a transmission gate formed using CMOS fabrication methods. Recently, dual-rail methods for high-speed operation have been used, but dual-rail methods may have the disadvantage that signal routing and chip area increase as the complementary signal is added. On the other hand, a single-rail method may provide that signal routing and chip area are reduced, but an inverting circuit may be required to generate complementary signals, adversely affecting high-speed operation and/or power consumption.

FIG. 1 illustrates a conventional exclusive-OR (XOR) circuit according to a single-rail method using a transmission gate and a CMOS transistor, and FIG. 2 illustrates a conventional exclusive-NOR (XNOR) circuit according to a signal-rail method using a transmission gate and a CMOS transistor.

Referring to FIG. 1, the conventional exclusive-OR circuit includes PMOS transistors P11 and P12, NMOS transistors N11 and N12, a transmission gate 13, and inverters 11, 12 and 14. Referring to FIG. 2, the conventional exclusive-NOR circuit includes PMOS transistors P21 and P22, NMOS transistors N21 and N22, a transmission gate 23, and inverters 21, 22 and 24.

In the conventional exclusive-OR circuit and exclusive-NOR circuit, the inverters 11, 12, 21 and 22 are used to generate complementary signals of the two input signals A and B, as shown in FIGS. 1 and 2. Because the transmission gate, the PMOS transistors, and the NMOS transistors operate after the complementary signals are generated by the inverters 11, 12, 21 and 22, a delay may occur while generating the complementary signals, and operation speed may be reduced.

SUMMARY

Some embodiments of the present invention may provide exclusive-OR circuits which perform high-speed operations without using complementary signals. Some other embodiments of the present invention may provide exclusive-NOR circuits which perform high-speed operations without using complementary signals. Still other embodiments of the present invention may provide exclusive-OR methods which perform high-speed operations without using complementary signals. Yet other embodiments of the present invention may provide exclusive-NOR methods which perform high-speed operations without using complementary signals.

According to some embodiments of the present invention, an exclusive-OR circuit may include a NAND gate which receives at least two input signals. A NOR gate may receive the input signals, and a switch circuit may transfer the output signal of the NAND gate to an output node when the output signal of the NOR gate is "LOW". A pull-down circuit may pull down the output node when the output signal of the NOR gate is "HIGH". The switch circuit may include a PMOS transistor which is connected between the output node and the output port of the NAND gate, and a gate of the PMOS transistor may be connected to the output port of the NOR gate. The pull-down circuit may include an NMOS transistor connected between the output node and a ground voltage, and a gate of the NMOS transistor may be connected to the output port of the NOR gate.

According to additional embodiments of the present invention, an exclusive-NOR circuit may include a NAND gate which receives at least two input signals, a NOR gate which receives the input signals, and a switch circuit which transfers the output signal of the NOR gate to an output node when the output signal of the NAND gate is "HIGH". A pull-up circuit may pull up the output node when the output signal of the NAND gate is "LOW".

The switch circuit may include an NMOS transistor connected between the output node and the output port of the NOR gate, and a gate of the NMOS transistor may be connected to the output port of the NAND gate. The pull-up circuit may include a PMOS transistor connected between the output node and a power supply voltage, and a gate of the PMOS transistor may be connected to the output port of the NAND gate.

According to other embodiments of the present invention, an exclusive-OR method may include receiving at least two input signals and performing a NAND operation thereon, and receiving the input signals and performing a NOR operation thereon. The result of the NAND operation may be output to an output node when the result of the NOR operation is "LOW". The result of the NAND operation may be blocked from being output to the output node, and the output node may be allowed to output a logic "LOW" when the result of the NOR operation is "HIGH".

According to still other embodiments of the present invention, an exclusive-NOR method may include receiving at least two input signals and performing a NAND operation thereon, and receiving the input signals and performing a NOR operation thereon. The result of the NOR operation may be output to an output node when the result of the NAND operation is "HIGH". The result of the NOR operation may be blocked from being output to the output node, and the output node may be allowed to output a logic "HIGH" when the result of the NOR operation is "LOW".

BRIEF DESCRIPTION OF THE DRAWINGS

FIG. 7 illustrates a truth table of the exclusive-OR circuits of FIGS. 3A-B and the exclusive-NOR circuits of FIGS. 5A-B.

DETAILED DESCRIPTION

Figure 1:
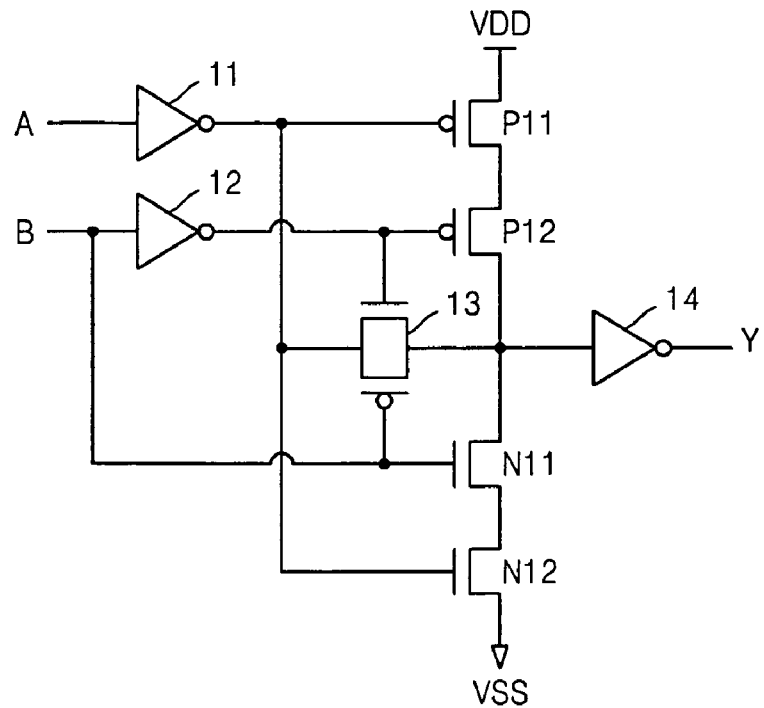
FIG. 1 is a circuit diagram illustrating a conventional exclusive-OR (XOR) circuit according to a single-rail method using a transmission gate and a CMOS transistor.

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art. Common reference numerals have been used, where possible, to designate elements that are common to different figures.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. As used herein the term "and/or" includes any and all combinations of one or more of the associated listed items and may be abbreviated by "/". Moreover, each embodiment described and illustrated herein includes its complementary conductivity type embodiment as well.

It will also be understood that, although the terms first, second, etc. may be used herein to describe various elements, these elements should not be limited by these terms. These terms are only used to distinguish one element from another element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3A:
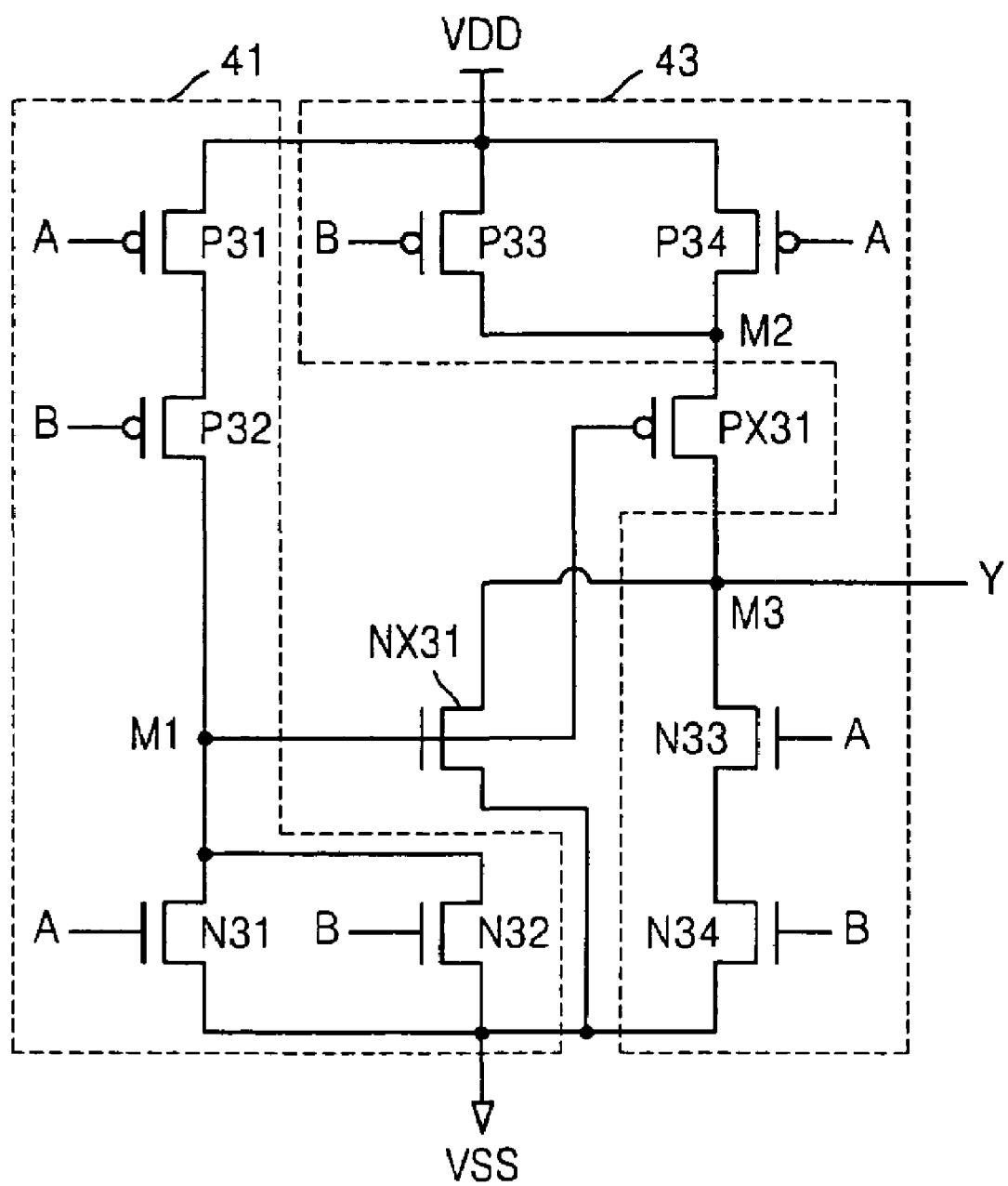
FIGS. 3A-B are circuit diagrams illustrating exclusive-OR circuits according to embodiments of the present invention.
Figure 4:
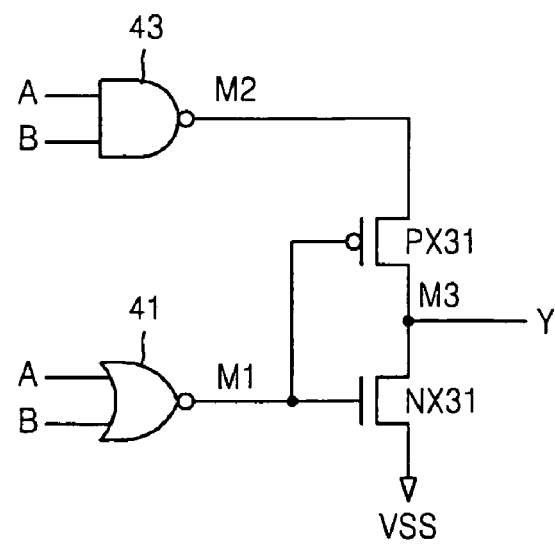
FIG. 4 is a circuit diagram illustrating an equivalent circuit of the exclusive-OR circuits of FIG. 3A and/or 3B.

FIG. 3A is a circuit diagram illustrating an exclusive-OR circuit according to embodiments of the present invention, and FIG. 4 is a circuit diagram illustrating an equivalent circuit of the exclusive-OR circuit of FIG. 3A. The exclusive-OR circuit includes a NOR gate 41, a NAND gate 43, a PMOS transistor PX31 (which functions as a switch) and an NMOS transistor NX31 (which functions as a pull-down element).

The NOR gate 41 performs a NOR operation on input signals A and B. The NAND gate 43 performs a NAND operation on the input signals A and B. The PMOS transistor PX31 transfers an output signal from port M2 of the NAND gate 43 to an output node M3 when the output signal from port M1 of the NOR gate 41 is "LOW". The NMOS transistor NX31 pulls down the output node M3 to a ground voltage level VSS when the output signal from the node M1 of the NOR gate 41 is "HIGH".

The PMOS transistor PX31 is connected between the output node M3 (providing an output signal Y) and the output port M2 of the NAND gate 43, and the gate of PMOS transistor PX31 is connected to the output port M1 of the NOR gate 41. The NMOS transistor NX31 is connected between the output node M3 and the ground voltage VSS, and the gate of the NMOS transistor NX31 is connected to the output port M1 of the NOR gate 41.

The NOR gate 41 and the NAND gate 43 may be CMOS type gates. The NOR gate 41 may include PMOS transistors P31 and P32 which are connected in series between a power supply voltage VDD and the output port M1 of the NOR gate 41, and NMOS transistors N31 and N32 which are connected in parallel between the output port M1 of the NOR gate 41 and the ground voltage VSS. The gates of the PMOS transistors P31 and P32 respectively receive the input signals A and B. The gates of the NMOS transistor N31 and N32 respectively receive the input signals A and B.

The NAND gate 43 may include PMOS transistors P33 and P34 which are connected in parallel between the power supply voltage VDD and the output port M2 of the NAND gate 43, and NMOS transistors N33 and N34 which are connected in series between the output node M3 and the ground voltage VSS. The gates of the PMOS transistors P33 and P34 respectively receive the input signals B and A. The gates of the NMOS transistors N33 and N34 respectively receive the input signals A and B.

Figure 3B:
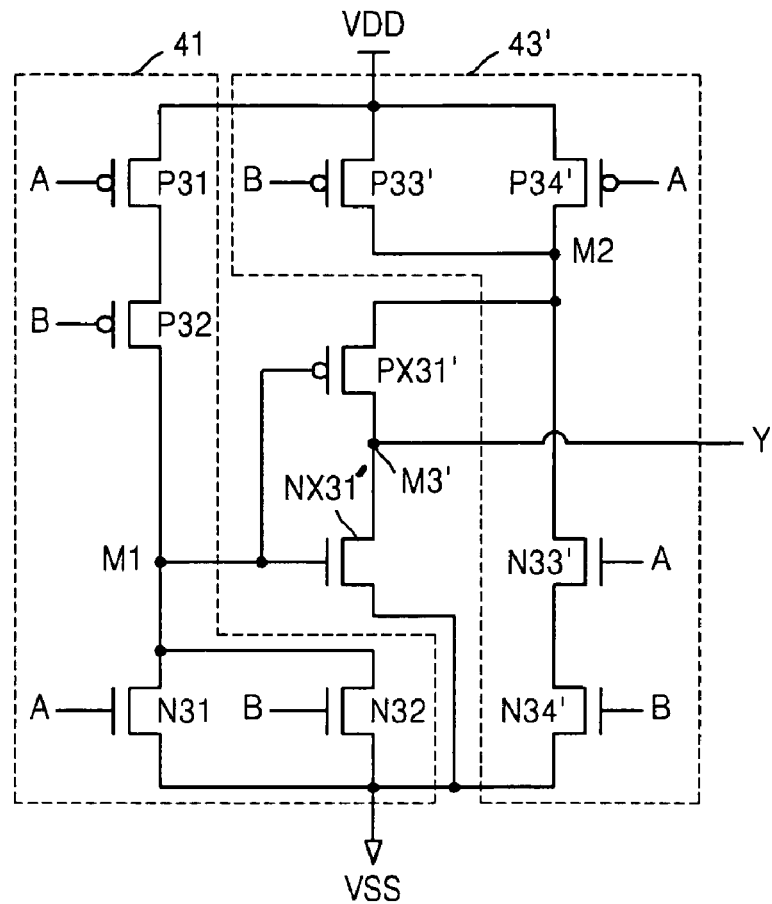

According to other embodiments of the present invention shown in FIG. 3B, the PMOS transistor PX31' and the output node M3' may be moved from between the PMOS transistors P33'-P34' and the NMOS transistors N33'-N34'. Accordingly, an electrical path between the PMOS transistors P33'-P34' and the NMOS transistors N33'-N34' through the NAND gate 43' may be free of the PMOS transistor PX31' and the output node M3'. Operations of the Exclusive-OR circuit of FIG. 3B may be the same as those discussed above with respect to FIG. 3A.

Figure 5A:
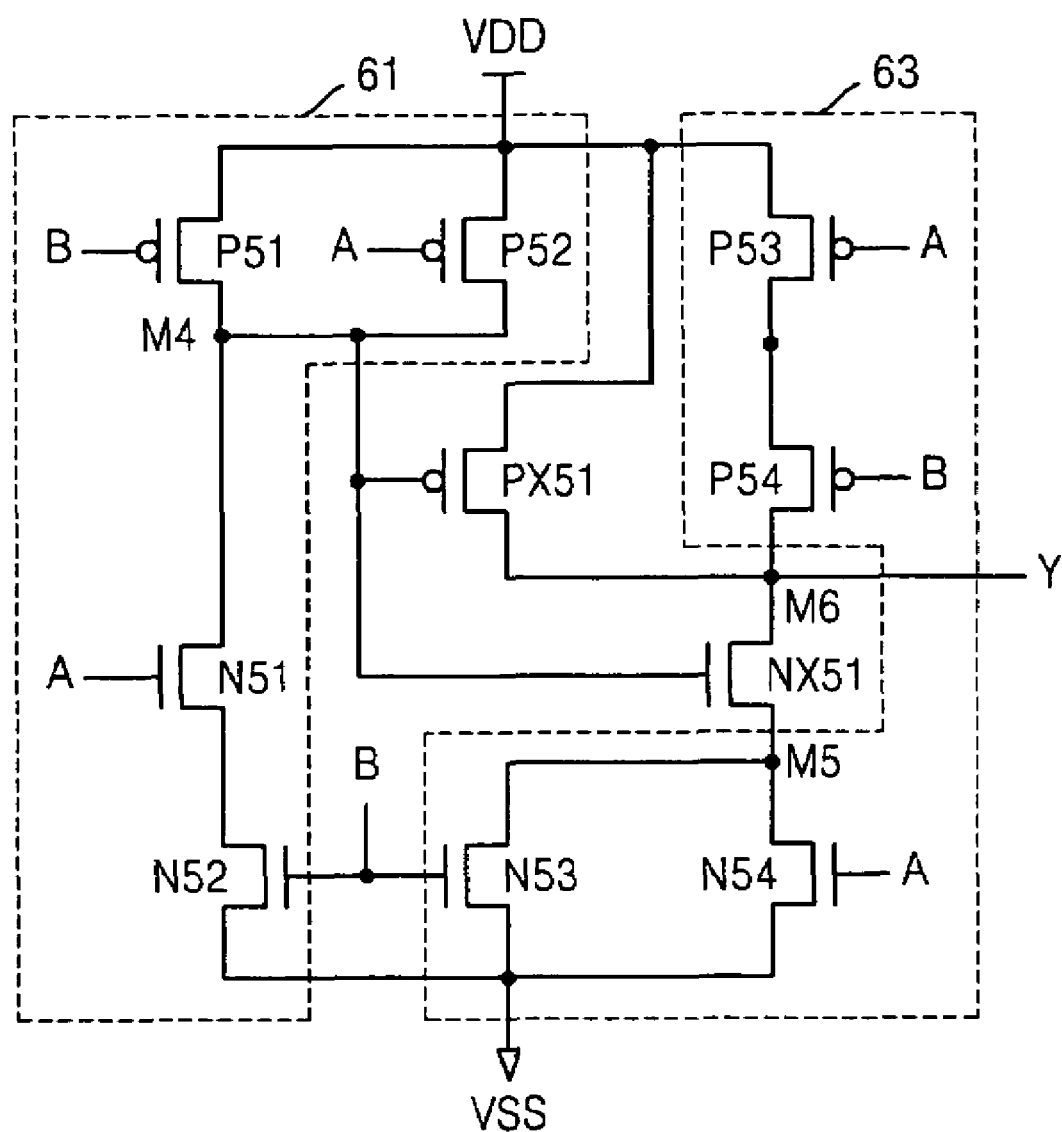
FIGS. 5A-B are circuit diagrams illustrating exclusive-NOR circuits according to embodiments of the present invention.
Figure 6:
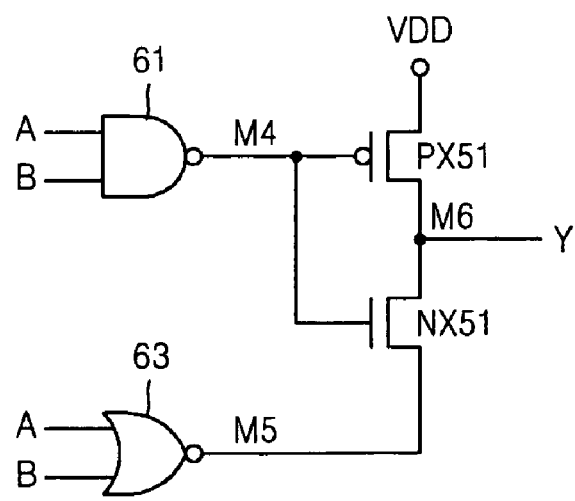
FIG. 6 is a circuit diagram illustrating an equivalent circuit of the exclusive-NOR circuits of FIG. 5A and/or 5B.

FIG. 5A is a circuit diagram illustrating an exclusive-NOR circuit according to embodiments of the present invention, and FIG. 6 is a circuit diagram illustrating an equivalent circuit of the exclusive-NOR circuit of FIG. 5A. The exclusive-NOR circuit may include a NAND gate 61, a NOR gate 63, an NMOS transistor NX51 (which functions as a switch) and a PMOS transistor PX51 (which functions as a pull-up element).

The NAND gate 61 performs a NAND operation on the input signals A and B. The NOR gate 63 performs a NOR operation on the input signals A and B. The NMOS transistor NX51 transfers an output signal from port M5 of the NOR gate 63 to an output node M6 when an output signal from port M4 of the NAND gate 61 is "HIGH". The PMOS transistor PX51 pulls up the output node M6 to the power supply voltage VDD level when the output signal from port M4 of the NAND gate 61 is "LOW".

The NMOS transistor NX51 may be connected between the output node M6 and the output port M5 of the NOR gate 63, and a gate of the NMOS transistor NX51 may be connected to the output port M4 of the NAND gate 61. The PMOS transistor PX51 may be connected between the output node M6 and the power supply voltage VDD, and a gate of the PMOS transistor PX51 may be connected to the output port M4 of the NAND gate 61.

The NAND gate 61 and the NOR gate 63 may be CMOS type gates. The NAND gate 61 may include PMOS transistors P51 and P52 connected in parallel between the power supply voltage VDD and the output port M4 of the NAND gate 61 and NMOS transistors N51 and N52 connected in series between the output port M4 of the NAND gate 61 and the ground voltage VSS. The gates of the PMOS transistors P51 and P52 respectively receive the input signals B and A. The gates of the NMOS transistors N51 and N52 respectively receive the input signals A and B.

The NOR gate 63 may include PMOS transistors P53 and P54 connected in series between the power supply voltage VDD and the output node M6, and NMOS transistors N53 and N54 connected in parallel between the output node M5 of the NOR gate 63 and the ground voltage VSS. The gates of the PMOS transistors P53 and P54 respectively receive the input signals A and B. The gates of the NMOS transistors N53 and N54 respectively receive the input signals B and A.

Figure 5B:
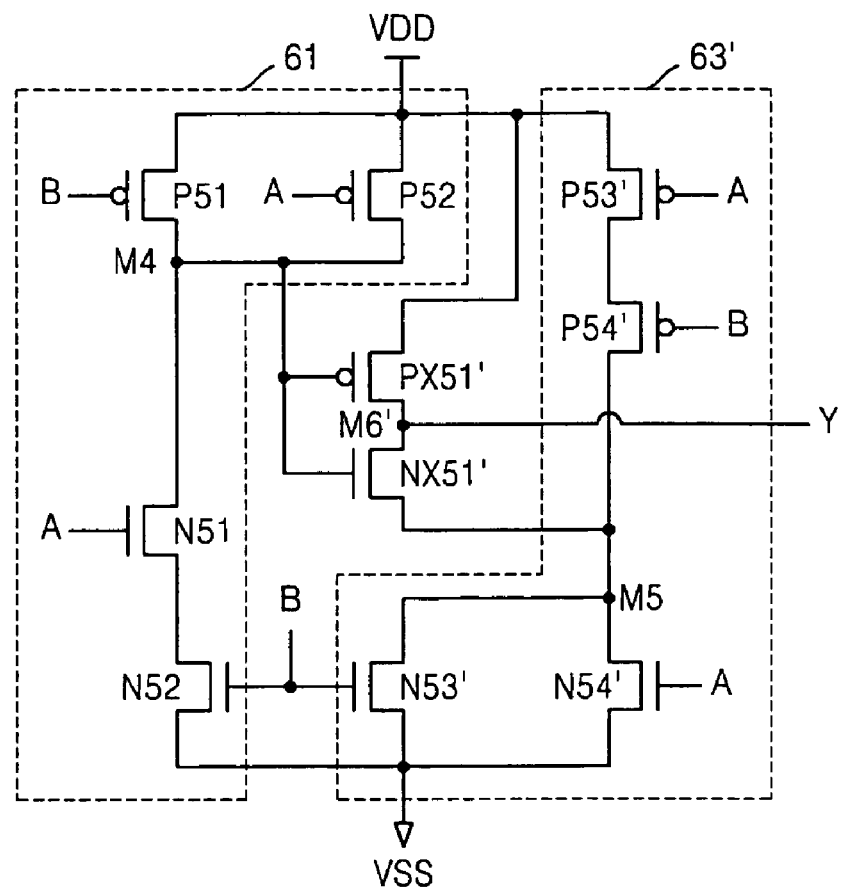

According to other embodiments of the present invention shown in FIG. 5B, the NMOS transistor NX51' and the output node M6' may be moved from between the PMOS transistors P53'-P54' and the NMOS transistors N53'-N54' of the NOR gate 63'. Accordingly, an electrical path between the PMOS transistors P53'-P54' and the NMOS transistors N53'-N54' through the NOR gate 63' may be free of the NMOS transistor NX51' and the output node M6'. Operations of the Exclusive-NOR circuit of FIG. 5B may be the same as those discussed above with respect to FIG. 5A.

FIG. 7 illustrates a truth table of the exclusive-OR circuits of FIGS. 3A-B and the exclusive-NOR circuits of FIGS. 5A-B.

Exclusive-OR methods according to embodiments of the present invention illustrated in the circuits of FIGS. 3A and 4 will now be explained. First, NAND gate 43 performs a NAND operation on the input signals A and B, and the NOR gate 41 performs a NOR operation on the input signals A and B.

When the result of the NOR operation is "LOW", the result of the NAND operation is output to the output node M3 through the switch PX31. When the result of the NOR operation is "HIGH", the result of the NAND operation is blocked from being output to the output node M3 by the switch PX31, and the pull-down element NX31 couples the output node M3 to the ground voltage VSS to output the logic "LOW".

Exclusive-NOR methods according to embodiments of the present invention performed in the circuit of FIGS. 5A and 6 will now be explained. First, NAND gate 61 performs a NAND operation on the input signals A and B, and the NOR gate 63 performs a NOR operation on the input signals A and B.

When the result of the NAND operation is "HIGH", the result of the NOR operation is output to the output node M6 through the switch NX51. When the result of the NAND operation is "LOW", the result of the NOR operation is blocked from being output to the output node M6 by the switch NX51, and the pull-up element PX51 couples the output node M6 to the power supply voltage VDD to output the logic "HIGH".

The exclusive-OR circuits and methods and the exclusive-NOR circuits and methods according to embodiments of the present invention do not use complementary signals of the input signals A and B, and thus do not require inverters to generate complementary signals. Accordingly, circuits and methods according to embodiments of the present invention may operate at a higher speeds than conventional circuit and methods.

Figure 2:
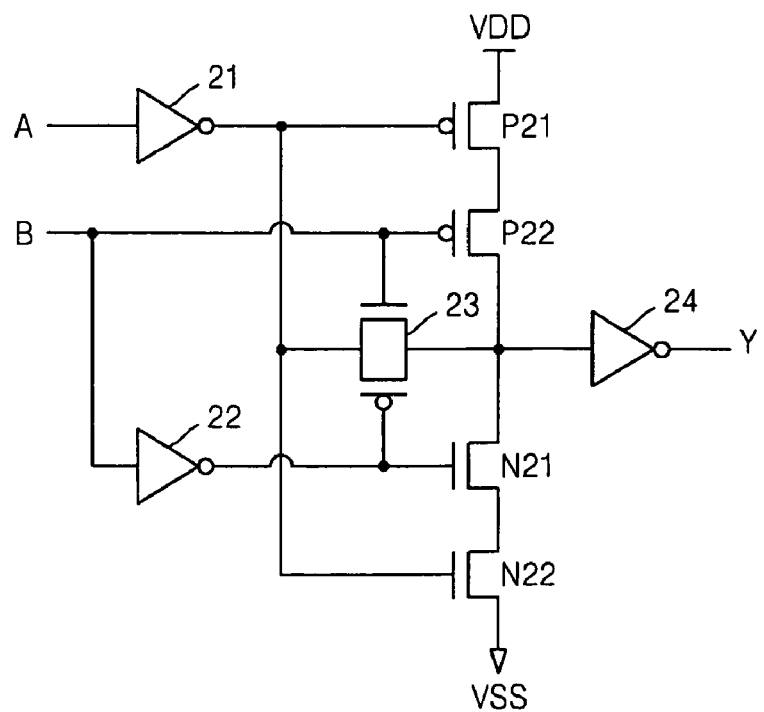
FIG. 2 is a circuit diagram illustrating a conventional exclusive-NOR (XNOR) circuit according to the signal-rail method using a transmission gate and a CMOS transistor.
Figure 8:
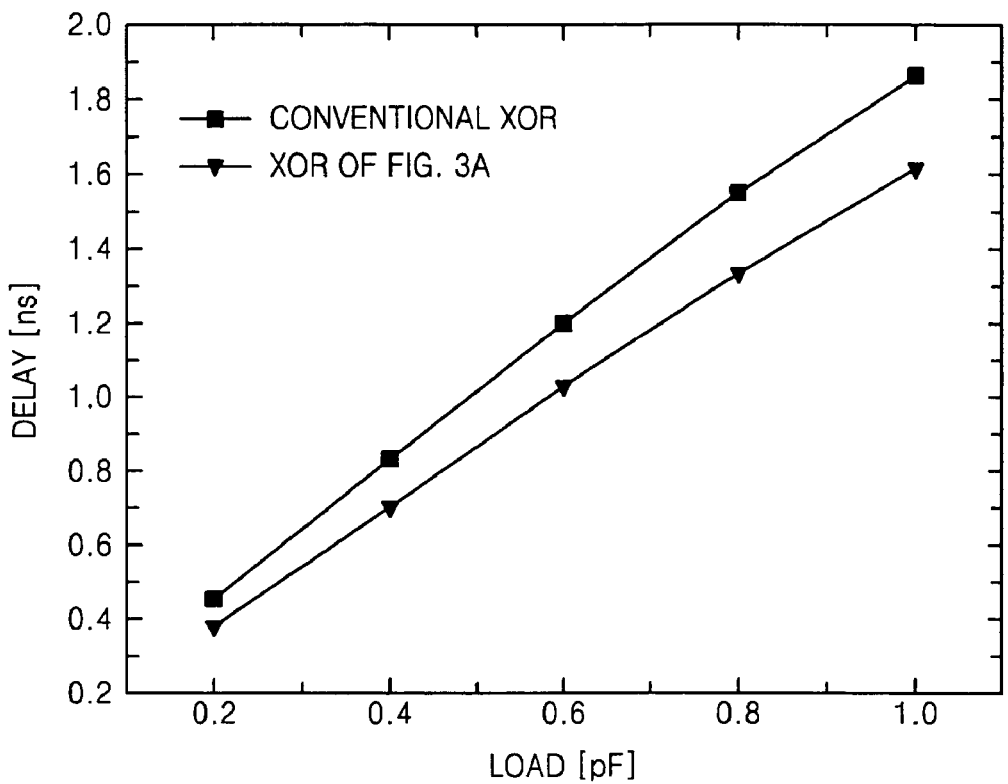
FIG. 8 illustrates simulation results of delay time (i.e. speed) of the conventional exclusive-OR circuit shown in FIG. 1 and the exclusive-OR circuit according to embodiments of the present invention shown in FIG. 3A.
Figure 9:
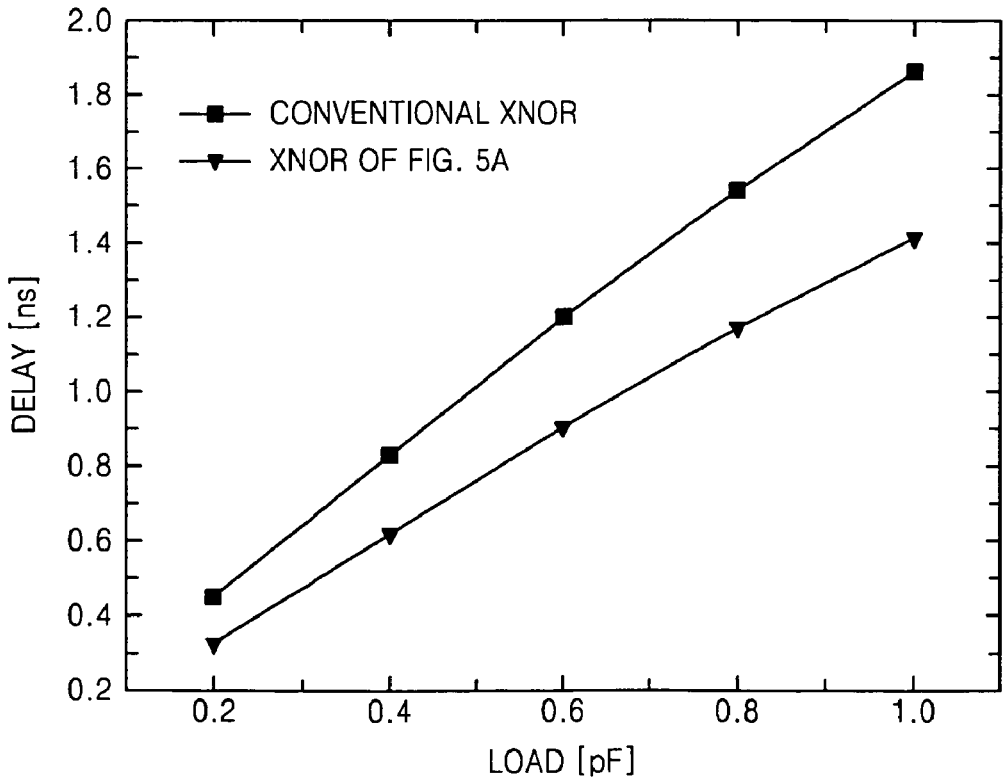
FIG. 9 illustrates simulation results of delay time (i.e. speed) of the conventional exclusive-NOR circuit shown in FIG. 2 and the exclusive-NOR circuit according to embodiments of the present invention shown in FIG. 5A.

FIG. 8 illustrates simulation results of delay times (i.e. speed) of the conventional exclusive-OR circuit shown in FIG. 1 and an exclusive-OR circuit according to embodiments of the present invention shown in FIG. 3A. FIG. 9 illustrates simulation results of delay time (i.e. speed) of the conventional exclusive-NOR circuit shown in FIG. 2 and an exclusive-NOR circuit according to embodiments of the present invention shown in FIG. 5A. Here, DELAY denotes the delay time (in nanoseconds) from a transition of the input signals A and B to a transition of the output signal Y, and LOAD denotes a capacitive load (in picofarads) on the node which outputs the output signal Y.

Referring to FIG. 8, it can be seen that the delay time of an exclusive-OR circuit according to embodiments of the present invention may be less than that of the conventional exclusive-OR circuit by about 14% to about 17%. Referring to FIG. 9, it can be seen that the delay time of an exclusive-NOR circuit according to embodiments of the present invention may be reduced relative to that of the conventional exclusive-NOR circuit by about 24% to about 26%.

Figure 10:
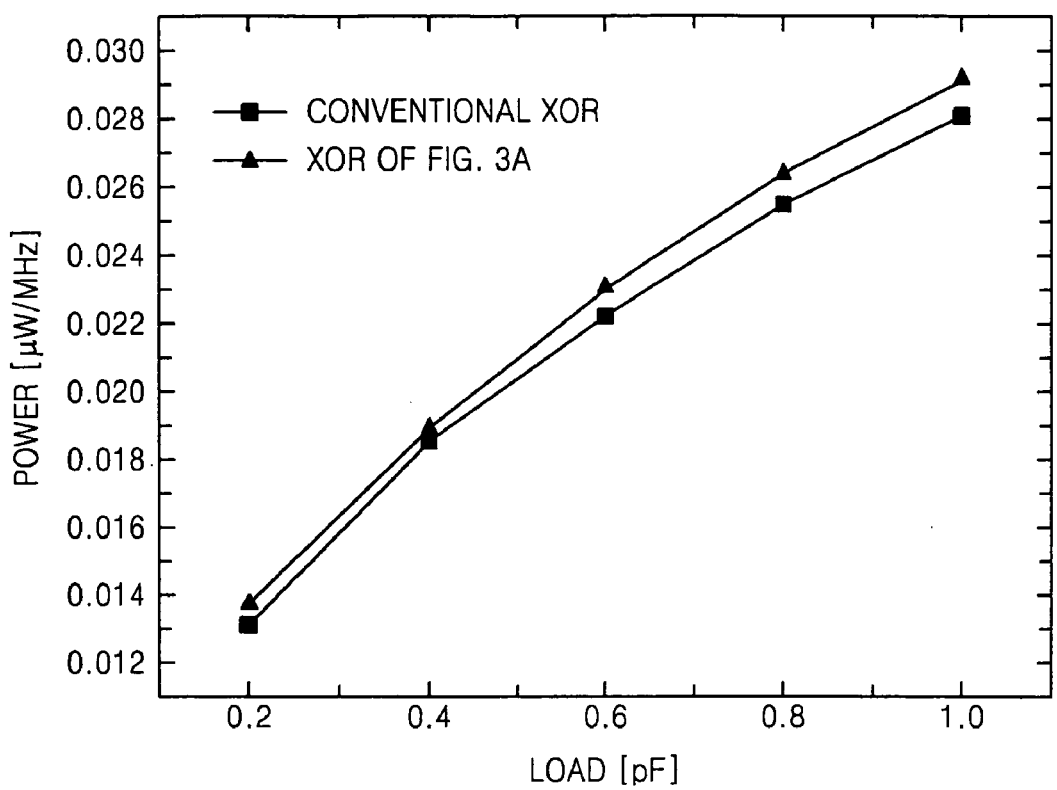
FIG. 10 illustrates simulation results of power consumption of the conventional exclusive-OR circuit shown in FIG. 1 and the exclusive-OR circuit according to embodiments of the present invention shown in FIG. 3A.
Figure 11:
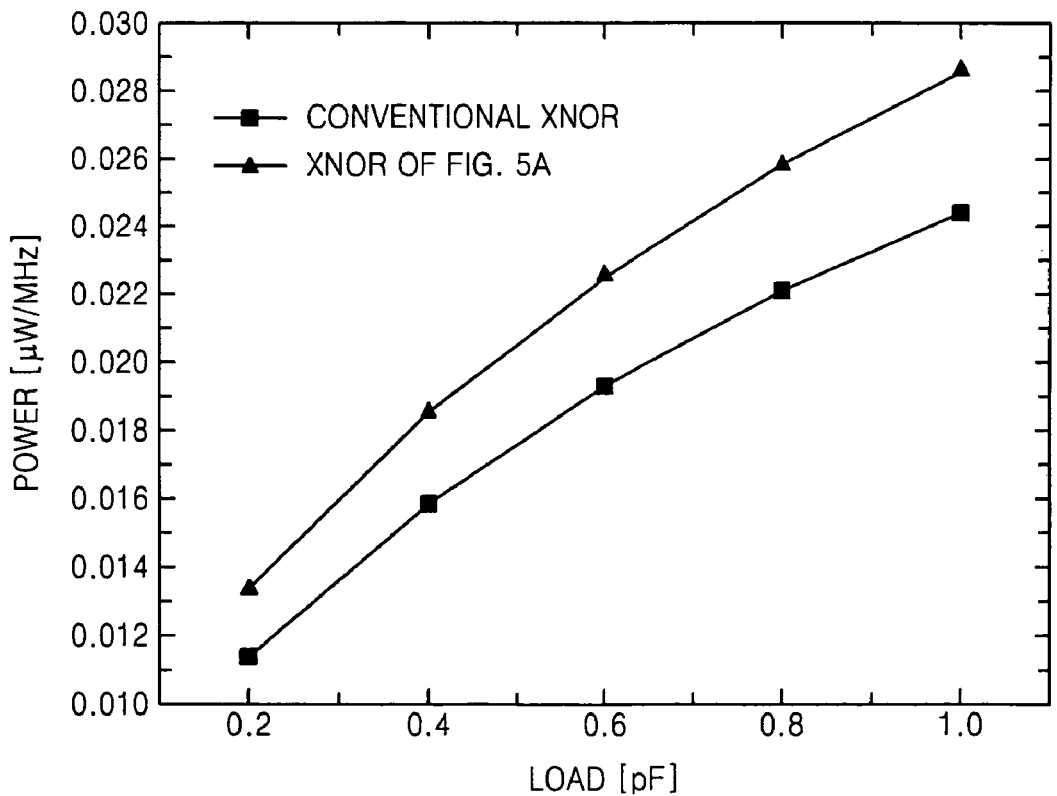
FIG. 11 illustrates simulation results of power consumption of the conventional exclusive-NOR circuit shown in FIG. 2 and the exclusive-NOR circuit according to embodiments of the present invention shown in FIG. 5A.

FIG. 10 illustrates simulation results of power consumption of the conventional exclusive-OR circuit shown in FIG. 1 and an exclusive-OR circuit according to embodiments of the present invention shown in FIG. 3A. FIG. 11 illustrates simulation results of power consumption of the conventional exclusive-NOR circuit shown in FIG. 2 and an exclusive-NOR circuit according to embodiments of the present invention shown in FIG. 5A. Here, POWER denotes power consumption (in microwatts/megahertz) and LOAD denotes a capacitive load (in picofarads) on the node which outputs the output signal Y.

Referring to FIG. 10, it can be seen that power consumption of an exclusive-OR circuit according to embodiments of the present invention may be greater than that of the conventional exclusive-OR circuit by about 3% to about 4%. Referring to FIG. 11, it can be seen that power consumption of an exclusive-NOR circuit according to embodiments of the present invention may be increased relative to that of the conventional exclusive-NOR circuit by about 16% to about 17%. Power consumption of circuits according to embodiments of the present invention may be greater than that of the conventional circuits because power consumption may slightly increase at the output port.

Figure 12:
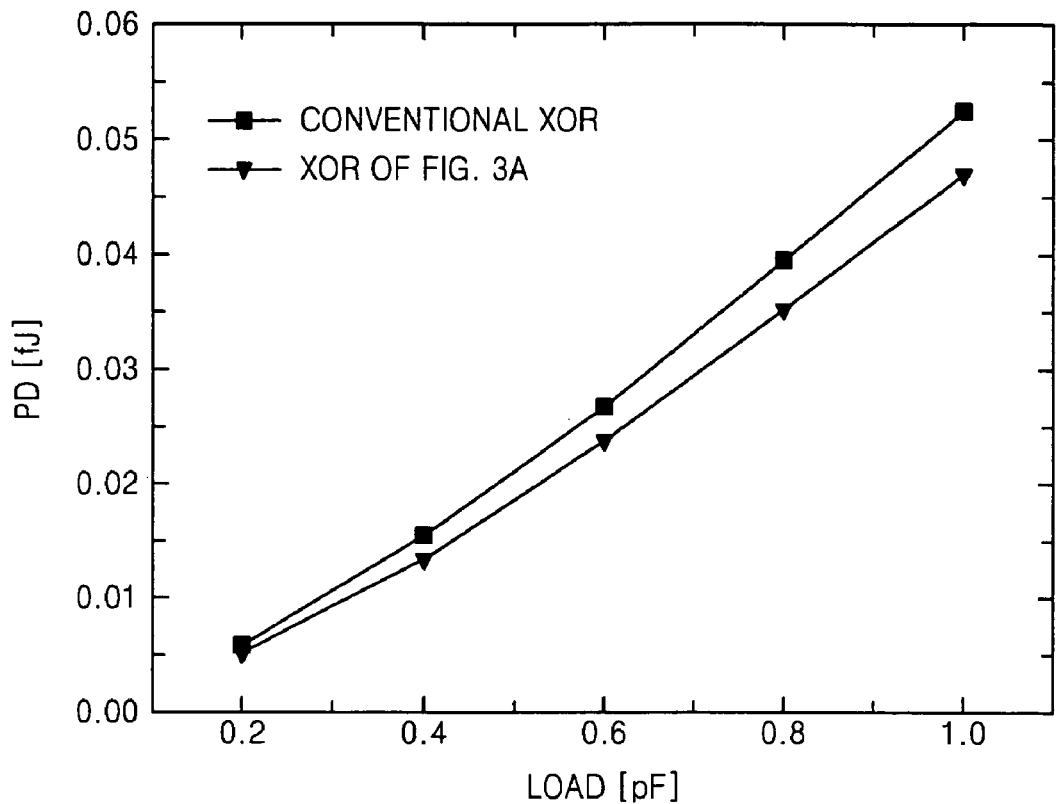
FIG. 12 illustrates simulation results of a product of delay time and power consumption in the conventional exclusive-OR circuit shown in FIG. 1 and the exclusive-OR circuit according to embodiments of the present invention shown in FIG. 3A.
Figure 13:
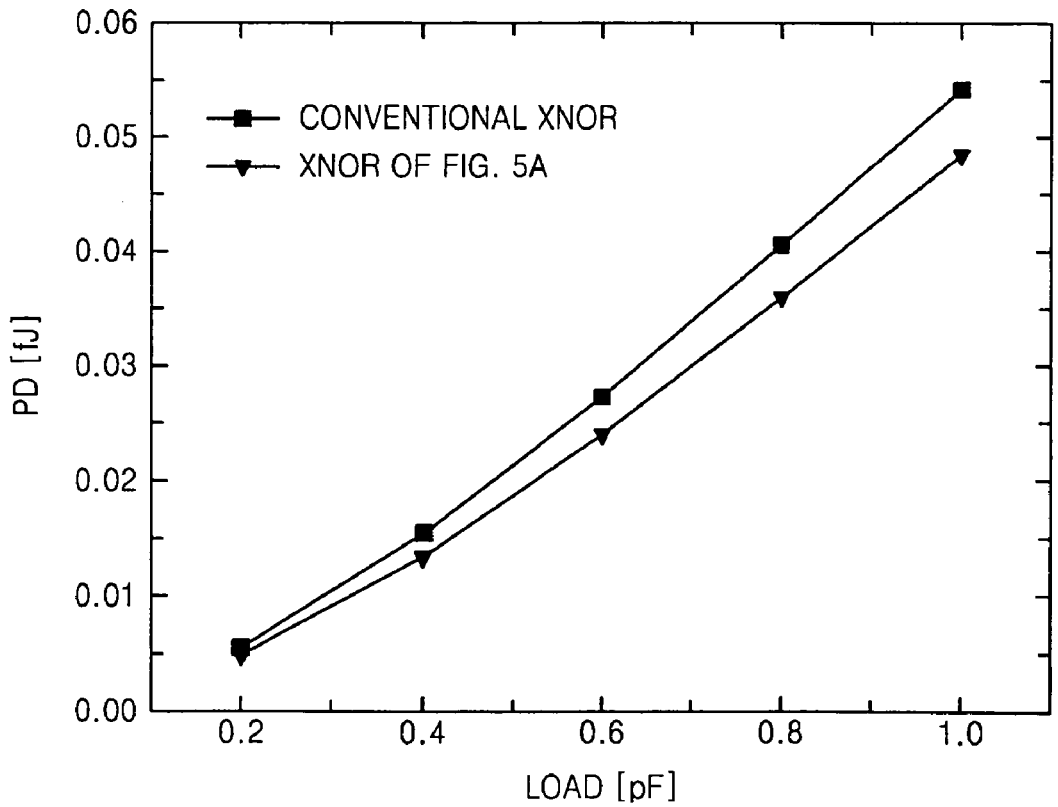
FIG. 13 illustrates simulation results of a product of delay time and power consumption in the conventional exclusive-NOR circuit shown in FIG. 2 and the exclusive-NOR circuit according to embodiments of the present invention shown in FIG. 5A.

FIG. 12 illustrates simulation results of products of delay time and power consumption in a conventional exclusive-OR circuit shown in FIG. 1 and an exclusive-OR circuit according to embodiments of the present invention shown in FIG. 3A. FIG. 13 illustrates simulation results of products of delay time and power consumption in the conventional exclusive-NOR circuit shown in FIG. 2 and an exclusive-NOR circuit according to embodiments of the present invention shown in FIG. 5A. Here, PD denotes results of multiplying the delay time by the power consumption, and LOAD denotes a capacitive load on the node which outputs the output signal Y.

Referring to FIG. 12, it can be seen that the performance of an exclusive-OR circuit according to embodiments of the present invention may be improved relative to that of the conventional exclusive-OR circuit by about 11% to about 13%. Referring to FIG. 13, it can be seen that performance of an exclusive-NOR circuit according to embodiments of the present invention may be improved relative to that of the conventional exclusive-NOR circuit by about 11% to about 13%.

These simulation results show that circuits according to embodiments of the present invention may be about 14% to about 26% faster than the conventional circuits, while using only about 3% to about 17% more power. This equates to about 11% to about 13% total performance gain over the conventional circuits, calculated by multiplying the delay time and the power consumption.

Exclusive-OR circuits and methods and exclusive-NOR circuits and methods according to embodiments of the present invention do not use complementary signals of the input signals A and B, and thus do not require inverters to generate the complementary signals. Accordingly, circuits and methods according to embodiments of the present invention may operate at higher speeds than conventional circuits and methods, and ma thus provide a higher total performance than conventional circuits and methods.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An exclusive-OR circuit comprising:
   a NAND gate configured to receive a plurality of input signals;
   a NOR gate configured to receive the plurality of input signals;
   a switch configured to couple an output signal of the NAND gate to an output node when an output signal of the NOR gate is at a first logic level; and
   a pull-down circuit configured to pull down the output node when the output signal of the NOR gate is at a second logic level different than the first logic level;
   wherein the NAND gate comprises,
      a plurality of PMOS transistors connected in parallel between a power supply voltage and an output port of the NAND gate, wherein gates of the plurality of PMOS transistors respectively receive the plurality of input signals, and
      a plurality of NMOS transistors connected in series between the output port of the NAND gate and a ground voltage, wherein gates of the plurality of NMOS transistors respectively receive the plurality of input signals, wherein an electrical path between the plurality of PMOS transistors and the plurality of NMOS transistors of the NAND gate is free of the switch and the output node.

2. An exclusive-OR circuit according to claim 1 wherein the first logic level is a "LOW" logic level and the second logic level is a "HIGH" logic level.

3. The exclusive-OR circuit according to claim 1, wherein the NOR gate comprises:
   a plurality of PMOS transistors connected in series between a power supply voltage and an output port of the NOR gate, wherein gates of the plurality of PMOS transistors respectively receive the plurality of input signals; and
   a plurality of NMOS transistors connected in parallel between the output port of the NOR gate and a ground voltage, wherein gates of the plurality of NMOS transistors respectively receive the plurality of input signals.

4. The exclusive-OR circuit according to claim 1, wherein the switch comprises a PMOS transistor connected between the output node and the output port of the NAND gate, wherein a gate of the PMOS transistor is configured to receive the output signal of the NOR gate.

5. The exclusive-OR circuit according to claim 1, wherein the pull-down circuit comprises an NMOS transistor connected between the output node and a ground voltage, wherein a gate of the NMOS transistor is configured to receive the output signal of the NOR gate.

6. An exclusive-OR circuit according to claim 1 further comprising:
   a second switch configured to provide an electrical coupling between the output node and the ground voltage when the output signal of the NOR gate is at a second logic level opposite the first logic level.

7. An exclusive-OR circuit according to claim 1 wherein an electrical path between the power supply voltage and the ground voltage through the plurality of PMOS transistors and the plurality of NMOS transistors is free of the switch and the output node.

8. An exclusive-NOR circuit comprising:
   a NAND gate configured to receive a plurality of input signals;
   a NOR gate configured to receive the plurality of input signals;
   a switch configured to couple an output signal of the NOR gate to an output node when an output signal of the NAND gate is at a first logic level; and
   a pull-up circuit configured to pull up the output node when the output signal of the NAND gate is at a second logic level different than the first logic level;
   wherein the NOR gate comprises:
      a plurality of PMOS transistors connected in series between a power supply voltage and an output port of the NOR gate, wherein gates of the plurality of PMOS transistors respectively receive the plurality of input signals; and
      a plurality of NMOS transistors connected in parallel between the output port of the NOR gate and a ground voltage, wherein gates of the plurality of NMOS transistors respectively receive the plurality of input signals wherein an electrical path between the plurality of PMOS transistors and the plurality of NMOS transistors of the NOR gate is free of the switch and the output node.

9. An exclusive-NOR circuit according to claim 8 wherein the first logic level is a "HIGH" logic level and the second logic level is a "LOW" logic level.

10. The exclusive-NOR circuit according to claim 8, wherein the NAND gate comprises:
   a plurality of PMOS transistors connected in parallel between a power supply voltage and an output port of the NAND gate, wherein gates of the plurality of PMOS transistors respectively receive the plurality of input signals; and
   a plurality of NMOS transistors connected in series between the output port of the NAND gate and a ground voltage, wherein gates of the plurality of NMOS transistors respectively receive the plurality of input signals.

11. The exclusive-NOR circuit according to claim 8, wherein the switch circuit comprises an NMOS transistor connected between the output node and the output port of the NOR gate, wherein a gate of the NMOS transistor is connected to the output port of the NAND gate.

12. The exclusive-NOR circuit according to claim 8, wherein the pull-up circuit comprises a PMOS transistor connected between the output node and a power supply voltage, wherein a gate of the PMOS transistor is connected to the output port of the NAND gate.

13. An exclusive-NOR circuit according to claim 8 further comprising:
   a second switch configured to provide an electrical coupling between the output node and the power supply voltage when the output signal of the NAND gate is at a second logic level opposite the first logic level.

14. An exclusive-NOR circuit according to claim 8 wherein an electrical path between the power supply voltage and the ground voltage through the plurality of PMOS transistors and the plurality of NMOS transistors is free of the switch and the output node.

15. An exclusive-OR circuit comprising:
   a NAND gate configured to receive a plurality of input signals;
   a NOR gate configured to receive the plurality of input signals;
   a switch PMOS transistor connected between an output node providing an output signal of the exclusive-OR circuit and an output port of the NAND gate, wherein a gate of the switch PMOS transistor is connected to an output port of the NOR gate; and
   a pull-down NMOS transistor connected between the output node and a ground voltage, wherein a gate of the pull-down NMOS transistor is connected to the output port of the NOR gate;
   wherein the NAND gate comprises:
      a plurality of PMOS transistors connected in parallel between a power supply voltage and the output port of the NAND gate, wherein gates of the plurality of PMOS transistors respectively receive the plurality of input signals; and
      a plurality of NMOS transistors connected in series between the output port of the NAND gate and a ground voltage, wherein gates of the plurality of NMOS transistors respectively receive the plurality of input signals wherein an electrical path between the plurality of PMOS transistors and the plurality of NMOS transistors of the NAND gate is free of the switch PMOS transistor and the output node.

16. The exclusive-OR circuit according to claim 15, wherein the NOR gate comprises:
   a plurality of PMOS transistors connected in series between a power supply voltage and the output port of the NOR gate, wherein gates of the plurality of PMOS transistors respectively receive the plurality of input signals; and
   a plurality of NMOS transistors connected in parallel between the output port of the NOR gate and the ground voltage, wherein gates of the plurality of NMOS transistors respectively receive the plurality of input signals.

17. An exclusive-OR circuit according to claim 15 further comprising:
   a switch NMOS transistor connected between the output node providing the output signal of the exclusive-OR circuit and the ground voltage, wherein a gate of the switch NMOS transistor is connected to an output port of the NAND gate.

18. An exclusive-OR circuit according to claim 15 wherein an electrical path between the power supply voltage and the ground voltage through the plurality of PMOS transistors and the plurality of NMOS transistors is free of the switch PMOS transistor and the output node.

19. An exclusive-NOR circuit comprising:
   a NAND gate that is configured to receive at least two input signals;
   a NOR gate that is configured to receive the input signals;
   a pull-up PMOS transistor connected between an output node providing an output signal and a power supply voltage, wherein a gate of the pull-up PMOS transistor is connected to an output port of the NAND gate; and
   a switch NMOS transistor connected between the output node and an output port of the NOR gate, wherein a gate of the switch NMOS transistor is connected to the output port of the NAND gate;
   wherein the NOR gate comprises:
      a plurality of PMOS transistors connected in series between a power supply voltage and an output port of the NOR gate, wherein gates of the plurality of PMOS transistors respectively receive the plurality of input signals; and
      a plurality of NMOS transistors connected in parallel between the output port of the NOR gate and a ground voltage, wherein gates of the plurality of NMOS transistors respectively receive the plurality of input signals wherein an electrical path between the plurality of PMOS transistors and the plurality of NMOS transistors of the NOR gate is free of the switch NMOS transistor and the output node.

20. The exclusive-NOR circuit according to claim 19, wherein the NAND gate comprises:
   a plurality of PMOS transistors connected in parallel between the power supply voltage and the output port of the NAND gate, wherein gates of the plurality of PMOS transistors respectively receive the input signals; and
   a plurality of NMOS transistors connected in series between the output port of the NAND gate and a ground voltage, wherein gates of the plurality of NMOS transistors respectively receive the input signals.

21. An exclusive-NOR circuit according to claim 19 further comprising:
   a switch PMOS transistor connected between the output node providing the output signal of the exclusive-NOR circuit and the power supply voltage, wherein a gate of the switch PMOS transistor is connected to the output port of the NAND gate.

22. An exclusive-NOR circuit according to claim 19 wherein an electrical path between the power supply voltage and the ground voltage through the plurality of PMOS transistors and the plurality of NMOS transistors is free of the switch NMOS transistor and the output node.

* * * * *